US009793169B1

(12) United States Patent
Cao et al.

(10) Patent No.: US 9,793,169 B1
(45) Date of Patent: Oct. 17, 2017

(54) METHODS FOR FORMING MASK LAYERS USING A FLOWABLE CARBON-CONTAINING SILICON DIOXIDE MATERIAL

(71) Applicant: GLOBALFOUNDRIES Inc., Grand Cayman (KY)

(72) Inventors: Huy Cao, Rexford, NY (US); Huang Liu, Mechanicville, NY (US); Guillaume Bouche, Albany, NY (US); Songkram Srivathanakul, Waterford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/175,187

(22) Filed: Jun. 7, 2016

(51) Int. Cl.
*H01L 21/02* (2006.01)
*H01L 21/8234* (2006.01)
*H01L 21/308* (2006.01)
*H01L 21/311* (2006.01)
*H01L 21/3115* (2006.01)

(52) U.S. Cl.
CPC .. *H01L 21/823431* (2013.01); *H01L 21/0214* (2013.01); *H01L 21/02126* (2013.01); *H01L 21/02211* (2013.01); *H01L 21/02216* (2013.01); *H01L 21/3081* (2013.01); *H01L 21/3086* (2013.01); *H01L 21/3115* (2013.01);
(Continued)

(58) Field of Classification Search
CPC ......... H01L 21/31116; H01L 21/31144; H01L 21/02126; H01L 23/53295; H01L 21/67069; H01L 21/31138; H01L 21/31633; H01L 21/0234; H01L 21/3086; H01L 21/32139; H01L 21/76224; H01L 21/02315; H01L 21/308; H01L 29/66795; H01L 21/3065; H01L 27/0886; H01L 21/0337; H01L 21/3081; H01L 21/3085; H01L 21/32; H01L 21/76205; H01L 21/823807; H01L 21/823821
See application file for complete search history.

(56) References Cited

U.S. PATENT DOCUMENTS 6,946,385 B2 * 9/2005 Kanamura ........ H01L 21/76811
257/E21.579
8,497,198 B2 * 7/2013 Chien ............... H01L 29/66795
438/197
(Continued)

OTHER PUBLICATIONS

Yaegashi et al., "Sustainability of Double Patterning Process for Lithographic Scaling," 2011 International Symposium on Lithography Extensions, Oct. 20, 2011.

*Primary Examiner* — Bac Au
(74) *Attorney, Agent, or Firm* — Amerson Law Firm, PLLC (57) ABSTRACT

One method disclosed herein includes, among other things, forming a process layer on a substrate, forming a carbon-containing silicon dioxide layer above the process layer and forming a patterned mask layer above the carbon-containing silicon dioxide layer. The patterned mask layer exposes portions of the carbon-containing silicon dioxide layer. A material modification process is performed on the exposed portions of the carbon-containing silicon dioxide layer to generate modified portions, and the modified portions are removed. The process layer is etched using remaining portions of the carbon-containing silicon dioxide layer as an etch mask.

20 Claims, 8 Drawing Sheets

(52) U.S. Cl.
CPC .. *H01L 21/31133* (2013.01); *H01L 21/31138* (2013.01); *H01L 21/31144* (2013.01)

(56) References Cited

U.S. PATENT DOCUMENTS

| | | | |
|---|---|---|---|
| 8,536,064 B2* | 9/2013 | Ko | H01L 21/31144 |
| | | | 257/E21.257 |
| 8,536,652 B2* | 9/2013 | Lee | H01L 21/764 |
| | | | 257/365 |
| 2004/0201108 A1* | 10/2004 | Kanamura | H01L 21/02118 |
| | | | 257/774 |
| 2006/0157851 A1* | 7/2006 | Kawashima | H01L 21/31116 |
| | | | 257/750 |
| 2014/0070322 A1 | 3/2014 | Jacob et al. | |
| 2015/0243509 A1* | 8/2015 | Chan | H01L 29/0649 |
| | | | 257/506 |
| 2015/0318393 A1 | 11/2015 | Masuoka et al. | |
| 2016/0064289 A1 | 3/2016 | Xiao | |
| 2016/0163833 A1 | 6/2016 | He et al. | |
| 2016/0172194 A1* | 6/2016 | Kunnen | H01L 21/76816 |
| | | | 257/618 |
| 2016/0276211 A1* | 9/2016 | Horikoshi | H01L 21/31116 |

* cited by examiner

METHODS FOR FORMING MASK LAYERS USING A FLOWABLE CARBON-CONTAINING SILICON DIOXIDE MATERIAL

BACKGROUND OF THE INVENTION

1. Field of the Invention

The present disclosure generally relates to the fabrication of integrated circuits, and, more particularly, to various methods for forming mask layers using a flowable carbon-containing silicon dioxide material.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

Figure 1:
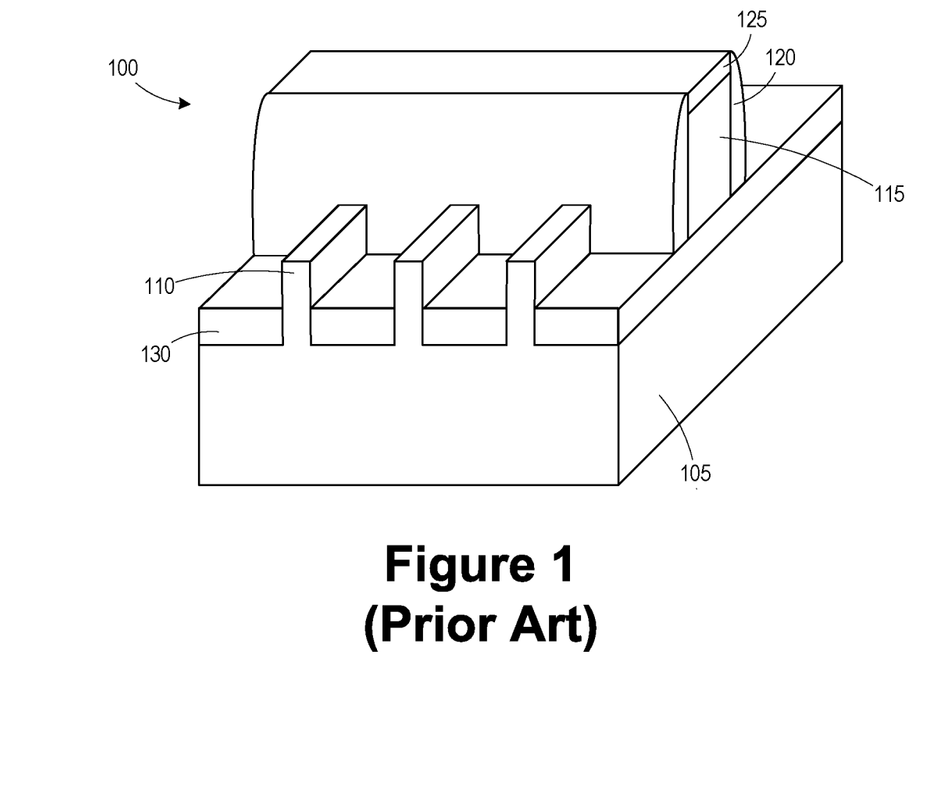
FIG. 1 is a perspective view of one illustrative embodiment of a prior art semiconductor product.

In some applications, fins for FinFET devices are formed such that the fin is vertically spaced apart from and above the substrate, with an isolation material positioned between the fin and the substrate. FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130 (e.g., silicon dioxide, a low-k material or an ultra-low-k material), a gate structure 115, sidewall spacers 120 (e.g., silicon nitride) and a gate cap layer 125 (e.g., silicon nitride). The fins 110 have a three-dimensional configuration: a height, a width and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

Typically, fins are formed in a regular array. The critical dimensions (CD) of the fins in the array are determined by the photolithography process employed in patterning the fins. Various techniques may be employed to achieve feature sizes that are smaller than the resolution limit of current photolithography processes. Techniques known in the art include double exposure, double patterning, spacer double patterning, self-aligned double patterning and self-aligned quadruple patterning. Due to their process complexities and material limitations, such processes present many challenges with respect to dimensional control, including CD erosion and pitch walking (i.e., non-uniformities in fin pitch and periodicity across the array).

Another problem area with semiconductor device fabrication in the deep sub-micron range is the patterning of interconnect features for the devices. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming mask layers using a flowable carbon-containing silicon dioxide material. One illustrative method includes, among other things, forming a process layer on a substrate, forming a carbon-containing silicon dioxide layer above the process layer and forming a patterned mask layer above the carbon-containing silicon dioxide layer. The patterned mask layer exposes portions of the carbon-containing silicon dioxide layer. A material modification process is performed on the exposed portions of the carbon-containing silicon dioxide layer to generate modified portions, and the modified portions are removed. The process layer is etched using remaining portions of the carbon-containing silicon dioxide layer as an etch mask.

Another illustrative method includes, among other things, forming a process layer on a substrate, forming a carbon-containing silicon dioxide layer above the process layer, forming a hard mask layer above the carbon-containing silicon dioxide layer and forming a patterned resist layer above the hard mask layer. The hard mask layer is etched in the presence of the patterned resist layer to define first openings exposing portions of the carbon-containing silicon dioxide layer. A material modification process is performed on the exposed portions of the carbon-containing silicon dioxide layer to generate modified portions and to remove the resist layer. The modified portions are removed. The process layer is etched using remaining portions of the carbon-containing silicon dioxide layer as an etch mask.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming mask layers using a flowable carbon-containing silicon dioxide material. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs.

The inventions disclosed herein should not be considered to be limited to the illustrative examples depicted and described herein. With reference to the attached figures, various illustrative embodiments of the methods and devices disclosed herein will now be described in more detail.

FIGS. 2A-2H depict one illustrative method disclosed for forming mask layers using a flowable carbon-containing silicon dioxide material for patterning an integrated circuit device product 200 defined on a semiconductor substrate 205. The illustrative product 200 shown in FIG. 2A includes a process layer 210 formed on the substrate 205. In some embodiments, the process layer 210 may be part of the substrate 205, such as an active region layer. In other embodiments, the process layer 210 may be a material different than the substrate 205, such as a dielectric layer (e.g., silicon dioxide, a low-k dielectric material, etc.). Additional layers may be present between the process layer 210 and the substrate 205, such as device layers in which functional devices, such as transistors, are formed, or metallization layers for forming interconnect structures. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers.

Figure 2A:
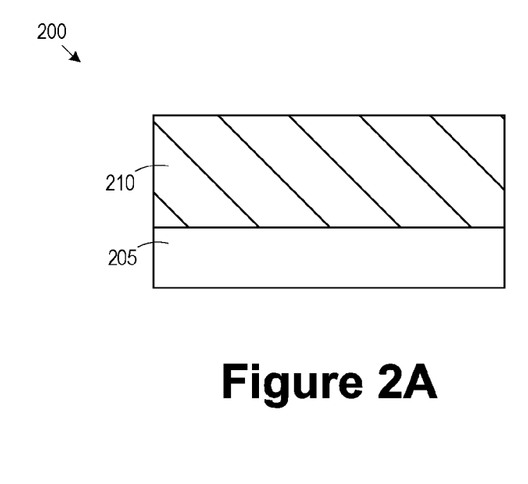
FIGS. 2A-2H depict one illustrative method disclosed for forming mask layers using a flowable carbon-containing silicon dioxide material.
Figure 2B:
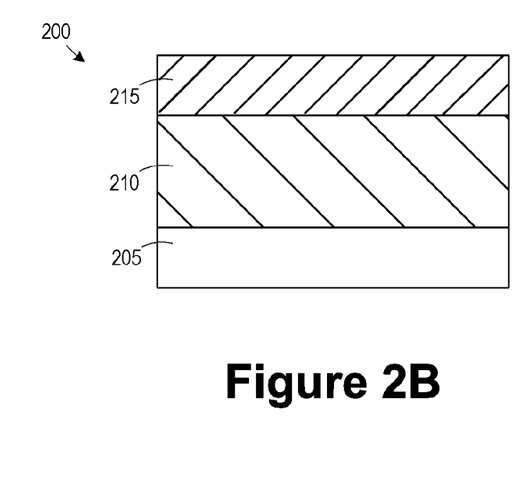

FIG. 2B illustrates the product 200 after a deposition process was performed to form a carbon-containing silicon dioxide layer 215 above the process layer 210. In one embodiment, the carbon-containing silicon dioxide layer 215 may be formed by providing octamethylcyclotetrasiloxane (OMCTS) and tetramethoxysilane (TMOS) precursors at a temperature up to about 100° C. to deposit the layer and then performing a cure treatment at a temperature between about 300° C. and 500° C. for between about 2 minutes and 10 minutes. In one embodiment, the carbon-containing silicon dioxide layer 215 may be SiOC or SiOCN.

Figure 2C:
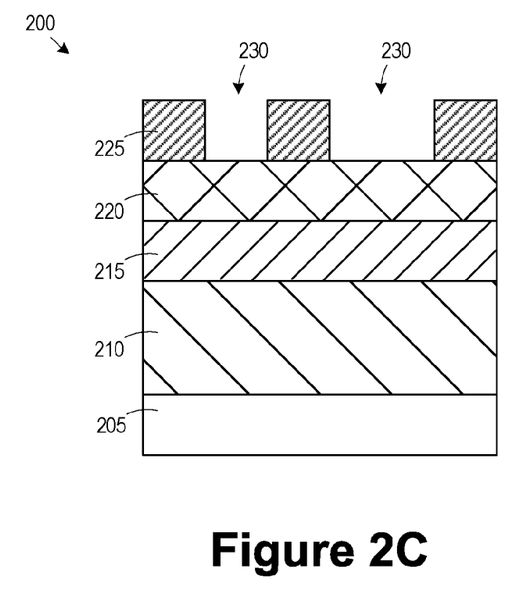

FIG. 2C illustrates the product 200 after a plurality of processes was performed. A first deposition process was performed to form a hard mask layer 220 (e.g., silicon dioxide, silicon nitride, silicon) above the carbon-containing silicon dioxide layer 215. A second deposition process was performed to form a resist layer 225 above the hard mask layer 220. A patterning process (e.g., lithography process) was performed to pattern the resist layer 225 to define openings 230. The openings 230 may be line type openings, via openings, block openings, etc. The pitch and width of the openings 230 may be consistent or they may vary. The openings 230 expose portions of the underlying hard mask layer 220.

Figure 2D:
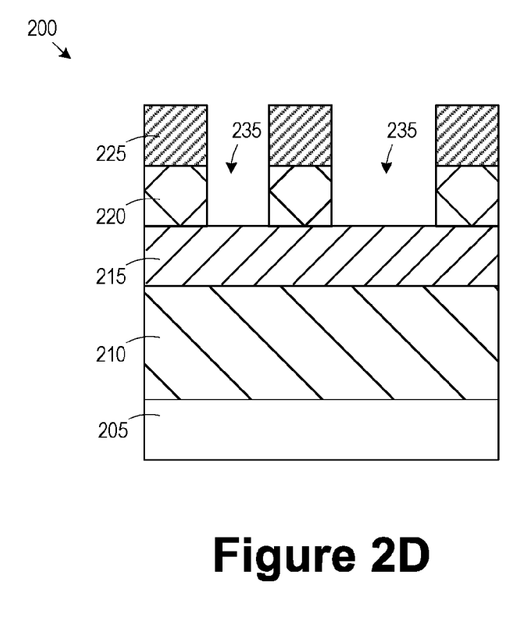

FIG. 2D illustrates the product 200 after an etch process (e.g., oxygen reactive ion etch) was performed to define openings 235 in the hard mask layer 220 corresponding to the openings 230 in the resist layer 225. The openings 235 expose portions of the underlying carbon-containing silicon dioxide layer 215.

Figure 2E:
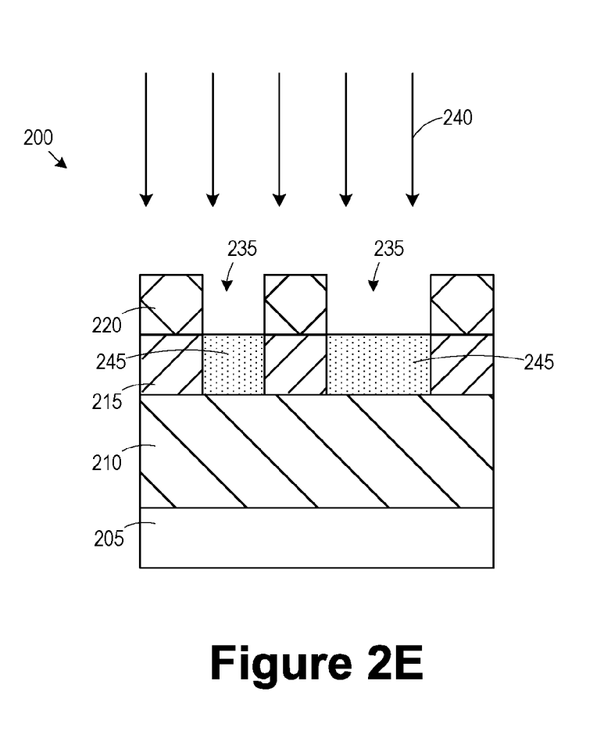

FIG. 2E illustrates the product 200 after a material modification process 240 was performed to modify the exposed portions of the carbon-containing silicon dioxide layer 215. In one embodiment, the material modification process 240 may be an ashing process, where a plasma is generated in a process ambient. In one embodiment, the plasma is generated in a process ambient including oxygen (e.g., 1 k-4 k sccm) and nitrogen (e.g., 100-500 sccm) using an unbiased power source (e.g., 4 kW-6 kW) at a pressure of about 400-1000 mtorr for about 30 seconds. Modified portions 245 of the carbon-containing silicon dioxide layer 215 exhibit a significantly higher wet etch rate as compared to the unmodified portions. For example, the wet etch rate in a diluted hydrofluoric acid (100:1) solution is increased from about 0.0014 A/min to over approximately 500 A/min. The etch rate in other etch solutions (e.g., $NH_4OH:H_2O_2:H_2O$ (SC1), hot phosphoric acid (HPO)) is also increased, but by a lesser degree. The material modification process 240 also removes the resist layer 225.

Figure 2F:
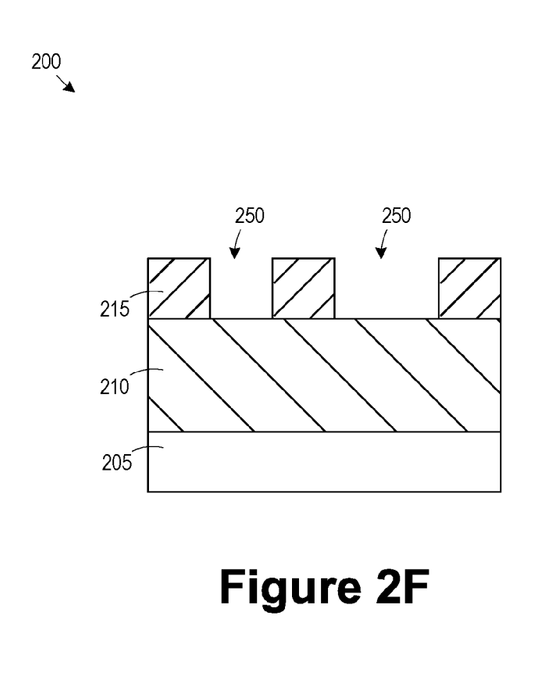

FIG. 2F illustrates the product 200 after a wet etch process (e.g., DHF) was performed to remove the modified portions 245 and the hard mask layer 220 selectively to the carbon-containing silicon dioxide layer 215, thereby exposing portions of the underlying process layer 210 through openings 250.

Figure 2G:
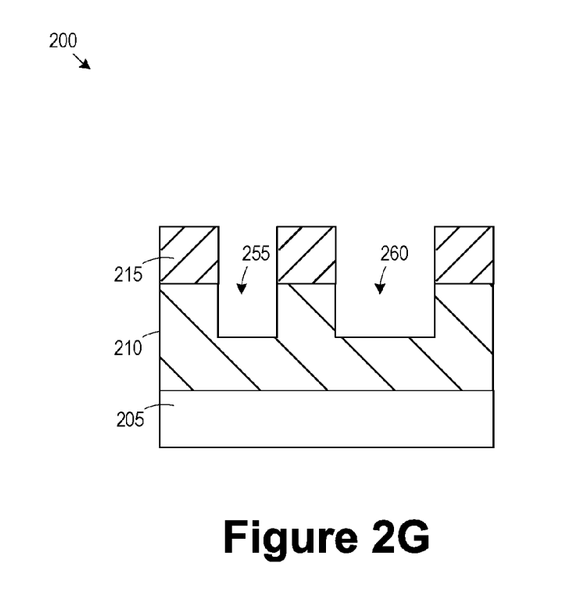

FIG. 2G illustrates the product 200 after an etch process was performed to etch the process layer 210. In an embodiment where the process layer 210 is a dielectric layer, the etch process may define recesses 255, 260 in the process layer 210. For example, the recess 255 may be a via recess for forming a plug-type contact to an underlying conductive structure (not shown), and the recess 260 may be a trench recess for forming a conductive line embedded in the process layer 210. In some embodiments, the remaining portions of the carbon-containing silicon dioxide layer 215 may be removed.

Figure 2H:
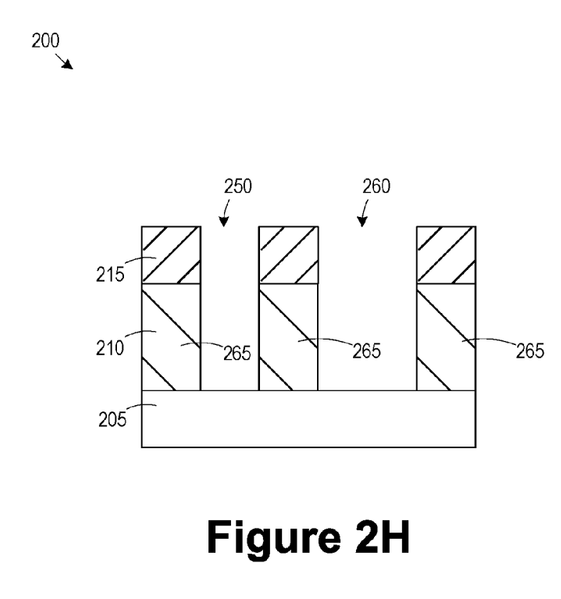

FIG. 2H illustrates an alternative embodiment of the product 200 of FIG. 2F after an etch process was performed to etch the process layer 210. In the alternative embodiment the process layer 210 may be silicon, a conductive material, a sacrificial material, etc. Raised features 265 may be defined in the process layer 210 (e.g., lines or blocks). For example, sacrificial gate electrode or contact features may be defined in an amorphous silicon process layer 210, and subsequently replaced with metal features later in the process flow. In some embodiments, the raised features 265 may be fins defined in a silicon or silicon alloy process layer 210.

FIGS. 3A-3F depict another illustrative method disclosed for forming mask layers using a flowable carbon-containing silicon dioxide material for patterning an integrated circuit device product 300 defined on a semiconductor substrate 305. The illustrative product 300 shown in FIG. 3A includes a process layer 310 formed on the substrate 305. In some embodiments, the process layer 310 may be part of the substrate 305, such as an active region layer. A deposition process was performed to form a hard mask layer 315 (e.g., silicon dioxide, silicon nitride, silicon) above the process layer 310. A second deposition process was performed to form a resist layer 320 above the hard mask layer 310. A patterning process (e.g., lithography process) was performed to pattern the resist layer 320 to define openings 325. The openings 325 may be line type openings, via openings, block openings, etc. The pitch and width of the openings 325 may be consistent or they may vary.

Figure 3A:
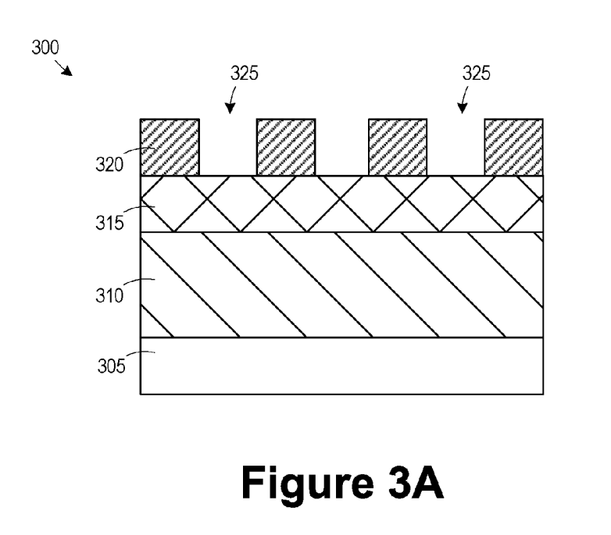
FIGS. 3A-3F depict another illustrative method disclosed for forming mask layers using a flowable carbon-containing silicon dioxide material.
Figure 3B:
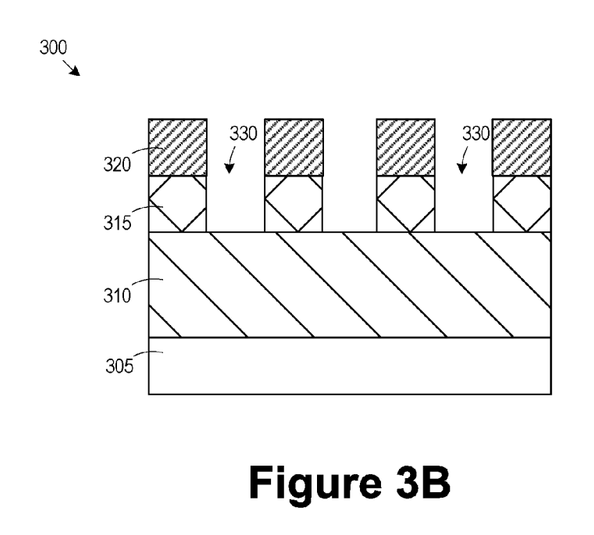

FIG. 3B illustrates the product 300 after an etch process (e.g., oxygen reactive ion etch) was performed to define openings 330 in the hard mask layer 315 corresponding to the openings 325 in the resist layer 320. The openings 330 expose portions of the underlying process layer 310.

Figure 3C:
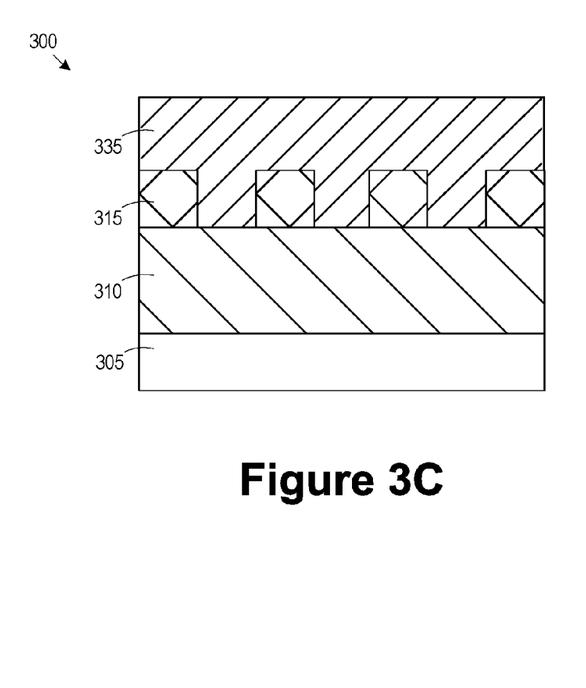

FIG. 3C illustrates the product 300 after a plurality of processes was performed. An ashing process was performed to remove the resist layer 320. A deposition process was performed to form a carbon-containing silicon dioxide layer 335 above the hard mask layer 315 and in the openings 330. In one embodiment, the carbon-containing silicon dioxide layer 335 may be SiOC or SiOCN.

Figure 3D:
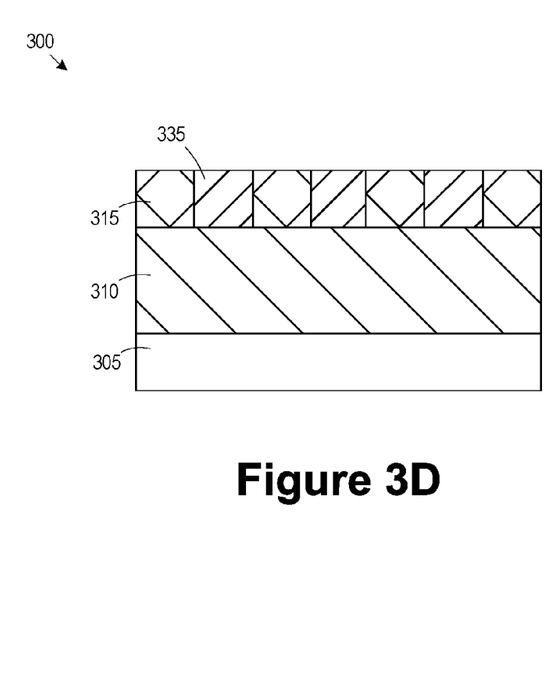

FIG. 3D illustrates the product 300 after a planarization process was performed to remove portions of the carbon-containing silicon dioxide layer 335 disposed above the hard mask layer 315 and outside the openings 330.

Figure 3E:
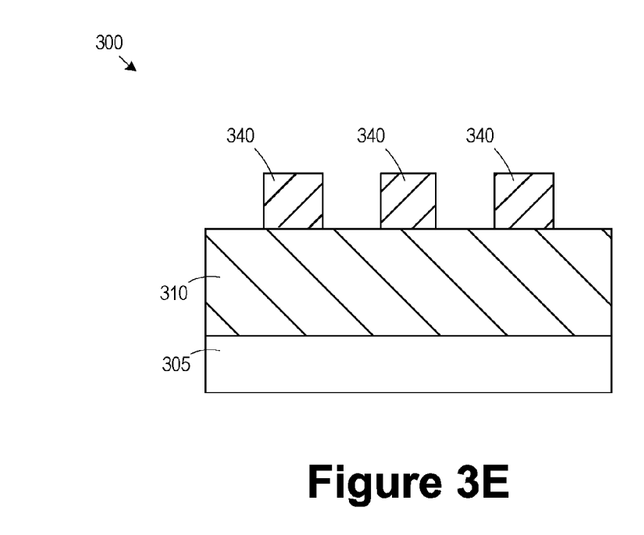

FIG. 3E illustrates the product 300 after an etch process was performed to remove the hard mask layer 315, thereby leaving patterned mask elements 340 from the remaining portions of the carbon-containing silicon dioxide layer 335. The mask elements 340 may be line features, plug features (e.g., with elliptical or rectangular cross sections), etc. In general, the mask elements 340 may be seen as pillars. In the embodiment illustrated in FIG. 3E, the mask elements 340 are line type elements, with axial lengths extending into the page. Although the mask elements 340 are illustrated as having uniform pitch and CD, in some embodiments, these parameters may vary.

Figure 3F:
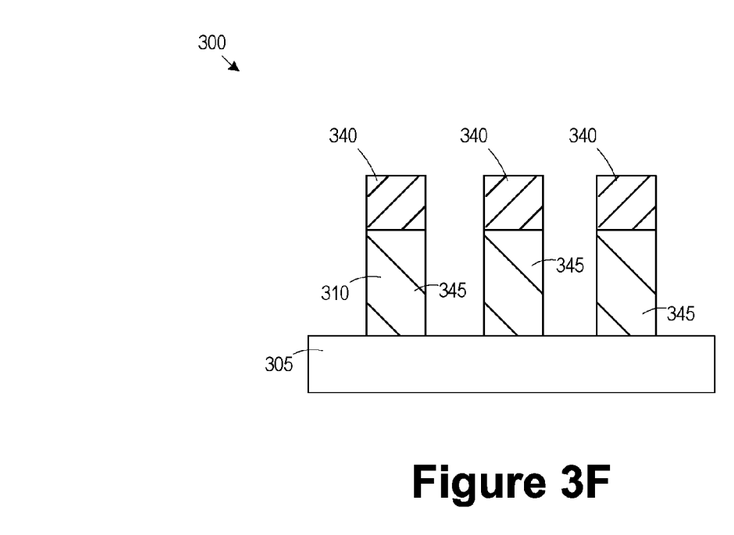

FIG. 3F illustrates the product 300 after an etch process was performed to etch the process layer 310 to transfer the pattern defined by the mask elements 340 to the process layer 310. In the alternative embodiment, the process layer 310 may be silicon, a conductive material, a sacrificial material, etc. Raised features 345, such as lines, blocks or pillars, may be defined in the process layer 310. For example, fins, sacrificial gate electrodes, contact features, etc. may be defined in the process layer 310. In some embodiments, the mask elements 340 may be removed, while in other embodiments, the mask elements 340 may serve as cap layers above the raised features 345. In one embodiment, where the process layer 310 is a dielectric layer, the mask elements 340 may define a template for etching recesses or trenches in the process layer 310.

The use of a carbon-containing silicon dioxide material to form mask elements has numerous advantages. The carbon-containing silicon dioxide material provides significant etch selectivity characteristics for wet and dry etch processes. The flowable nature of the carbon-containing silicon dioxide material when it is deposited provides gap fill capabilities so that the mask elements can be formed by filling in gaps defined in a layer and planarizing the material. These advantages have the propensity to reduce problems associated with erosion or pitch walking.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a process layer on a substrate;
forming a carbon-containing silicon dioxide layer above said process layer;
forming a patterned mask layer above said carbon-containing silicon dioxide layer, said patterned mask layer exposing portions of said carbon-containing silicon dioxide layer;
performing a material modification process on said exposed portions of said carbon-containing silicon dioxide layer to generate modified portions;
removing said modified portions; and
etching said process layer using remaining portions of said carbon-containing silicon dioxide layer as an etch mask.

2. The method of claim 1, wherein said material modification process comprises an ashing process.

3. The method of claim 2, wherein said ashing process comprises a plasma etch process performed in a process ambient including oxygen.

4. The method of claim 2, wherein removing said modified portions comprises performing a wet etch process.

5. The method of claim 1, wherein forming said patterned mask layer comprises:
forming a hard mask layer above said carbon-containing silicon dioxide layer;
forming a patterned resist layer above said hard mask layer; and
etching said hard mask layer using said patterned resist layer to form said patterned mask layer.

6. The method of claim 5, wherein said material modification process removes said patterned resist layer.

7. The method of claim 6, wherein said material modification process comprises an ashing process.

8. The method of claim 1, wherein said carbon-containing silicon dioxide layer comprises SiOC.

9. The method of claim 1, wherein said carbon-containing silicon dioxide layer comprises SiOCN.

10. The method of claim 1, further comprising removing said patterned mask layer prior to etching said process layer.

11. The method of claim 1, wherein said process layer comprises a dielectric layer, and etching said process layer comprises forming recesses in said process layer.

12. The method of claim 1, wherein said process layer comprises a semiconductor layer, and etching said process layer comprises forming raised features in said process layer.

13. The method of claim 12, wherein said raised features comprise fins.

14. A method, comprising:
forming a process layer on a substrate;
forming a carbon-containing silicon dioxide layer above said process layer;
forming a hard mask layer above said carbon-containing silicon dioxide layer;
forming a patterned resist layer above said hard mask layer;
etching said hard mask layer in the presence of said patterned resist layer to define first openings exposing portions of said carbon-containing silicon dioxide layer;
performing a material modification process on said exposed portions of said carbon-containing silicon dioxide layer to generate modified portions and to remove said patterned resist layer;
removing said modified portions; and
etching said process layer using remaining portions of said carbon-containing silicon dioxide layer as an etch mask.

15. The method of claim 14, wherein said material modification process comprises an ashing process.

16. The method of claim 15, wherein said ashing process comprises a plasma etch process performed in a process ambient including oxygen.

17. The method of claim 15, wherein removing said modified portions comprises performing a wet etch process.

18. The method of claim 14, wherein said carbon-containing silicon dioxide layer comprises SiOC.

19. The method of claim 14, wherein said carbon-containing silicon dioxide layer comprises SiOCN.

20. The method of claim 14, further comprising removing said patterned mask layer prior to etching said process layer.

* * * * *